United States Patent [19]

Jungkman

[11] Patent Number: 4,766,316
[45] Date of Patent: * Aug. 23, 1988

[54] DISC DETECTOR ASSEMBLY HAVING VACUUM CHAMBER

[75] Inventor: David L. Jungkman, Hudson, N.H.

[73] Assignee: Honeywell Inc., Minneapolis, Minn.

[*] Notice: The portion of the term of this patent subsequent to Apr. 28, 2004 has been disclaimed.

[21] Appl. No.: 763,153

[22] Filed: Aug. 7, 1985

[51] Int. Cl.⁴ .............................. G01J 5/16
[52] U.S. Cl. ............................... 250/352; 62/514 R; 62/514 JT
[58] Field of Search .......... 250/352; 62/514 R, 514 JT

[56] References Cited

U.S. PATENT DOCUMENTS

| | | | |
|---|---|---|---|
| 3,851,173 | 11/1974 | Taylor et al. | 250/352 |
| 4,041,314 | 8/1977 | Oppelt . | |
| 4,386,505 | 6/1983 | Little | 165/168 |
| 4,474,036 | 10/1984 | Ball et al. . | |
| 4,488,414 | 12/1984 | Jungkman et al. | 250/352 |
| 4,491,729 | 1/1985 | Stahl et al. | 250/352 |
| 4,555,626 | 11/1985 | Suzuki | 250/352 |

FOREIGN PATENT DOCUMENTS 0012878  1/1977  Japan ..................... 250/352

OTHER PUBLICATIONS

"Small Wonders", Microminiature Refrigerators for Cooling Detectors" by Wolfe et al., Photonics Spectra Jul. 1983.

Primary Examiner—Craig E. Church
Assistant Examiner—John C. Freeman
Attorney, Agent, or Firm—George A. Leone, Sr.; John S. Solakian

[57] ABSTRACT

A miniature, evacuated and hermetically sealed detector refrigerator assembly for use in infrared imaging systems incorporates a miniature Joule-Thomson laminar refrigerator which serves as the substrate for the detector subassembly, electrical leads, as well as the primary structural element of the assembly. The detector subassembly is positioned on the cold region of the refrigerator, surrounded by a vacuum chamber and capped by an optical window or filter as required. As a result, the detector is cooled in a small and relatively inexpensive package that can operate intermittently or continuously, as desired.

15 Claims, 1 Drawing Sheet

DISC DETECTOR ASSEMBLY HAVING VACUUM CHAMBER

BACKGROUND OF THE INVENTION

The device of the present invention relates to cryogenically cooled detector assemblies, and, more particularly, to miniaturized cryogenically cooled detector assemblies used for thermal imaging systems.

In most thermal imaging systems using semiconductor detection devices, it is necessary to place the detectors in a vacuum environment for two reasons: first, to protect the detectors from condensation of gases, since the detectors operate at cryogenic temperatures, and second, to minimize heat load to the cryogenic refrigerator by these same gases. In the past, the cryogenic cooler (or "refrigerator") design and general packing requirements have been such that the detector dewar/refrigerator was economically nonexpendable. Because of the refrigerator size, the packaging of the system was generally large, and, therefore, the total system costs were high. Since the package design and weight were large, the cool-down time for these systems was relatively long.

As a result, the use of cryogenically cooled infrared detectors was limited to applications in which cool-down time and portability are not critical, and in which the detector system is reusable, for example, in airborne infrared reconnaissance cameras, tank or periscope sights, etc. The cost, size, weight and cool-down time of such systems have, for the most part, barred their use in small heat-seeking munitions.

Recently, a fast cool-down, low cost "microminiature" refrigerator has become commercially available, which, if packaged properly with infrared detectors makes possible the use of detection assemblies in a variety of small, low cost applications. These applications include infrared binoculars, munitions, and other either highly portable or expendable applications. The theory and design of the refrigerator has been fully described by Robert Wolfe and Robert Duboc, Jr., "Small Wonders: Microminiature Refrigerators for Cooling Detectors", Photonics Spectra, July, 1983. A brief summary of these devices is included here as background to the apparatus of the present invention.

Like the prior art refrigerators typically used in infrared imaging systems, the new microminiature refrigerator operates on the principle of the Joule-Thomson effect. Gas at high pressure is expanded rapidly through a small orifice and therefore cools. The cooled gas is passed through a heat exchanger to precool the high pressure incoming gas, which provides lower temperature during expansion. This regenerative process continues to the liquification temperature of the gas. In prior imaging systems, a typical refrigerator was embodied in a long cylindrical "cold finger" consisting of capillary tubes and cooling fins, wherein the cooling function was directed to the end of the cylindrical cold finger. To complete the refrigerator, a close fitting closed cylinder was required to contain and direct the cold exhaust gas over the incoming high pressure gas in the heat exchanger area. This closed cylinder of precise diameter and length is incorporated into the detector dewar. The closed end is the detector support. A vacuum container surrounds the cylinder to limit heat flow and condensation.

These prior art refrigerators have several problems which make them impractical for use in small portable or expendable systems. First, the size of the refrigerator necessarily leads to a large package (dewar) size. Second, because of the large dewar size and the mass of associated components, these devices generally require several minutes to achieve operating cryogenic temperature. Third, the cost is increased because of several factors. For example, the cost to provide the precision diameter of the closed cylinder is increased. Also, the closed cylinder is approximately two (2) inches long so that, although the detectors are small, the package must be large in order to contain the refrigerator and must be of precise size. Further, since the area of the refrigerator is large, the surrounding gas must be removed, i.e., a vacuum is required, all of which increases cost. This vacuum must be maintained over the desired life of the system so that thermal conduction through the vacuum space will not increase the refrigerator temperature. The detector sitting on the end of the cold finger must be located accurately with respect to the optical system. To achieve this precise position many parts of the detector dewar require close tolerance manufacture and special assembly jigs. Finally, obtaining a hard vacuum requires glass-to-metal seals, welds, solder joints or brazes which are relatively expensive.

In the microminiature refrigerator design, the capillary tube and expansion chamber system comprising the Joule-Thomson refrigerator is embedded in a low thermally conductive substrate, such as glass. This device may take any geometric form, but generally is comprised of thin glass plates which have been etched to provide the required ports and capillary channels for the heat exchange sections, which are laminated to form a single planar element. Conventional infrared detector systems using the microminiature refrigerator have utilized packaging concepts similar to those embodied in systems having large prior art refrigerators. Specifically, in such systems the detector assembly has been mounted on the cold spot of the microminiature refrigerator, and the refrigerator has been placed inside a large vacuuable housing with an optical window located near the detector assembly. Pump-out ports, getters, and electrical vacuum feedthroughs typical of prior art systems have been included. In some cases, the electrical leads from the detector assembly have been printed directly on the refrigerator substrate.

One detector dewar assembly using such microminiature refrigerator design is shown in U.S. Pat. No. 4,488,414, issued Dec. 18, 1984, and assigned to the same assignee as the present invention. In such design, a foam insulated heat exchanger and a back-filled gas cavity is used.

It is, accordingly, an object of the present invention to provide an improved detector packaging assembly which is compact, requires fewer parts, has no tolerance build-up and is not expensive to build.

It is another object of the present invention to provide a self-contained detector package which is suited for use in portable systems requiring "instant on" capability, for example, in infrared binoculars, or infrared gun sights.

It is a further object of the present invention to provide a refrigerator and detector assembly design which can withstand high shock environments.

It is yet another object of the present invention to provide a miniature detector/refrigerator package that will operate continuously or intermittently.

SUMMARY OF THE INVENTION

The above and other objects of the present invention are achieved by using the microminiature planar refrigerator as both the substrate for the detector assembly and as the primary structural element of the package. The perimeter of the refrigerator remains at room temperature. Its surface has the electrical leads deposited on it from the cold spot to the perimeter which is at room temperature. A vacuum chamber is used to insulate the cold surfaces. The housing, optical windows, etc., that complete the package are also supported by the refrigerator, which may be disc shaped for example.

The microminiature refrigerator provides fast cooldown time, shock resistance, compact size and low cost, such that a package may be developed that can be considered expendable. This detector package may be incorporated into disposable systems. It may also be incorporated into any system requiring a small low cost detector package.

In the present invention, the detector assembly is placed directly on the cold spot of the microminiature refrigerator. The electrical lead pattern is photodeposited directly on the surface of the refrigerator. The electrical leads extend near the edges of the substrate, which are at ambient temperature. For example, in a disc shaped refrigerator, leads would terminate at contact pads located near the disc circumference. For a refrigerator of rectangular shape, the leads would terminate at pads near one or more of the edges thereof. A flexible cable may be coupled to the contact pads and connected at the other end to system electronics.

The immediate area surrounding the detector assembly is thermally insulated using a vacuum chamber. In a device using a disc shaped refrigerator, this vacuum chamber might comprise a cup shaped chamber surrounding the detector assembly and covering the heat exchanger area, which is capped with an optical window. The window may be a spectral filter and/or a lens. Although much of the top surface of the refrigerator is covered by the vacuum chamber, the electrical contact pads remain exposed at the perimeter.

BRIEF DESCRIPTION OF THE DRAWING(S)

The above and other objects of the present invention are achieved in the illustrative embodiment as described with respect to the Figures in which.

DETAILED DESCRIPTION OF THE PREFFERED EMBODIMENT(S)

Figure 1:
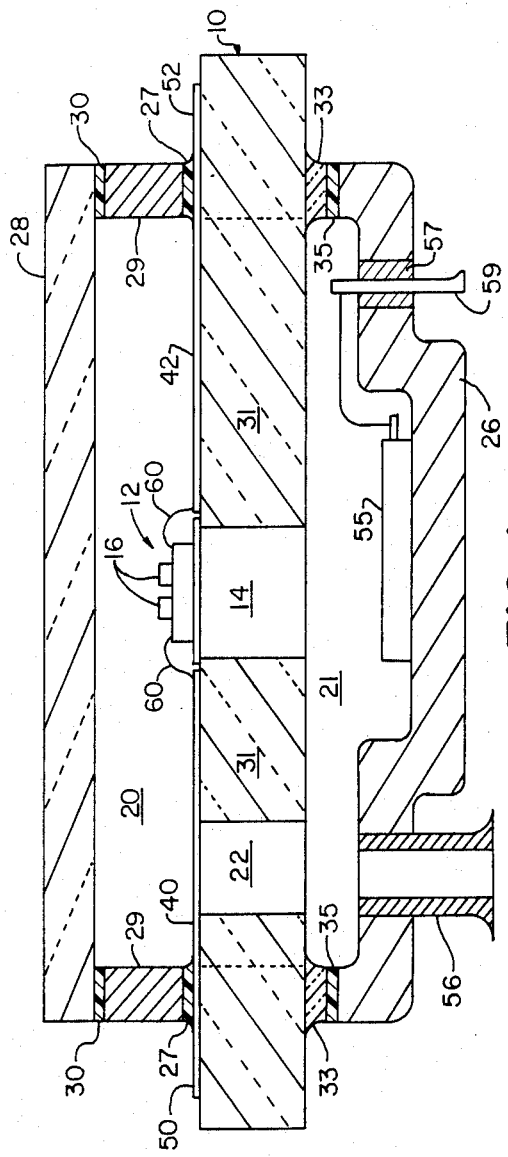
FIG. 1 shows a cut-away view of the apparatus of the present invention.

Referring to FIG. 1 a portion of an infrared receiver is shown, specifically, the refrigerator and detector assemblies comprising the apparatus of the present invention. This apparatus includes a microminiature refrigerator assembly 10, detector assembly 12, vacuum chambers 20 and 21 coupled together through hole 22 in assembly 10, supporting members 29, 35 and 26, and optical window 28.

Detector subassembly 12 is mounted directly onto the cryogenically cooled portion 14 of refrigerator 10. Detector electrical leads 40 and 42 (and others not shown), and contact pads 50 and 52 (and others not shown), are deposited directly on the surface of refrigerator 10 using well-known depositional techniques. Jumper wires 60 may be used to connect the detector assembly 12 with the detector electrical leads 40 and 42. If necessary, a cold shield, for example, slot shield 16, may be attached to detector assembly 12 to improve performance.

The structure of refrigerator 10 is such that region of the refrigerator is at cryogenic temperatures, and the outer portion of the disc circumference under and around the contact pads is at ambient temperature. The region 31 in between (between region 14 and the vertical dotted line) is the heat exchanger area which is at an intermediate temperature.

Rings 29 and 35 are bonded to the upper and lower surfaces of the refrigerator 10 with glass frit 27 and 33, and when fired the glass frit 27 and 33 reflows and forms hermetic seals between the rings 29 and 35 and the refrigerator 10. During reflow, the glass frit 27 flows over and around the electrical leads 40 and 42, etc., without compromising hermeticity or electrical conductivity. The resulting interface will provide hermetically sealed electrical feedthroughs for the detector assembly 12. The bottom supporting member 26 is soldered to ring 35. The member 26 includes a getter 55 to provide continued vacuum pumping after sealing the induced vacuum through pinch-off tube 56. Member 26 also includes a getter feedthrough 57 for getter electrical leads 59 which, for example, may be a brazed electrical feedthrough 57.

Figure 2:
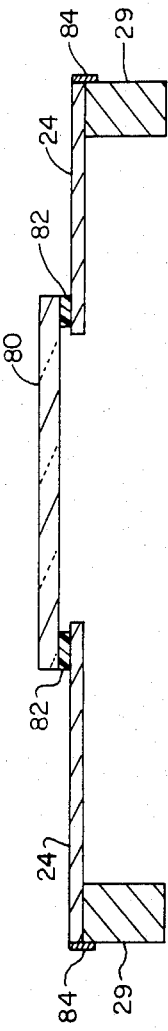
FIG. 2 shows an alternative embodiment of a portion of the apparatus of FIG. 1.

The optical window 28, which may be coated to form a spectral filter and/or shaped into a lens, is attached to ring 29 with solder or glass frit 30. In an alternate embodiment, as shown in FIG. 2, a window 80 (similar to window 28) is attached to flange 24 by solder or frit 82. The flange 24 is welded to ring 29 at area 84. The inner surfaces of lower member 26 and ring 29 are polished and coated to minimize emissivity and to reduce radiation heat loading of refrigerator 10.

The resulting package provides a hermetically sealed vacuum chamber 21 which, together with chamber 20, has no organic or adhesive seals. The two chambers 20 and 21 are coupled together through vacuum hole 22 which is located in refrigerator assembly 10 in a manner so as to not interfere with the electrical leads, such as leads 40 and 42, or the heat exchanger 71. As shown in U.S. Pat. No. 4,488,414, the disc detector assembly of the present invention also includes a gas input port and a gas output port which connects to the refrigerator 10 outside the vacuum space so that the refrigerator will, by use of an external gas supply, also not shown, cool down the detector assembly 12.

Having described the invention, what is claimed as new and novel and for which it is desired to obtain Letters Patent is:

1. An infrared energy apparatus for receiving infrared energy from a scene of interest, said apparatus having a refrigerator Dewar device, said apparatus comprising:
   A. said refrigerator device comprising:
   (i) an upper surface and a lower surface,
   (ii) means for cooling a first region of said refrigerator device,
   (iii) a second region which remains substantially at the ambient temperature of said infrared energy apparatus, and
   (iv) a third region for heat exchange, said third region at an intermediate temperature between that of said first region and said second region;

B. a detector assembly having one or more detector elements mounted on said upper surface of said refrigerator device in said first region such that said detector assembly is cooled by operation of said refrigerator device;

C. an electrically conductive pattern applied to said upper surface of said refrigerator device, said pattern having electrical leads to enable electrical connection to said detector elements of said detector assembly;

D. a vacuum chamber means for thermally insulating said first region and said third region from ambient environments, said vacuum chamber means shaped such that energy entering said receiver from said scene of interest may be collected and measured by said assembly, and wherein said vacuum chamber means is hermetic and comprises an upper vacuum member bonded to the upper surface and a lower vacuum member bonded to the lower surface of said refrigerator device, and means, included in said refrigerator device, for connecting said upper vacuum member to said lower vacuum member; and E. an optically transparent means, coupled to said vacuum chamber means over said first region such that energy of the desired wave and from said scene of interest may be collected and measured by said detector assembly.

2. An apparatus as in claim 1 wherein said refrigerator device comprises a miniature planar disc-shaped refrigerator having said first region located substantially at the center of said disc shape, and said refrigerator device having said third region located substantially around said first region and said second region along the circumference of said disc shape.

3. An apparatus as in claim 1 wherein said means for connecting is a hole in said refrigerator device, said hole including the vacuum in said upper and lower vacuum members.

4. An apparatus as in claim 1 further comprising a getter for maintaining said vacuum in said vacuum chamber means and wherein said getter is mounted in said lower vacuum member.

5. An apparatus as in claim 1 wherein said upper vacuum member includes a sidewall enclosing the sides of said upper vacuum member and wherein said optically transparent means is substantially all of the top surface of said upper vacuum member.

6. An apparatus as in claim 5 wherein said side of said upper vacuum member is coupled to said top surface of said refrigerator device so as to provide a hermetic seal for said vacuum and without affecting said electrical leads.

7. An apparatus as in claim 6 wherein said hermetic seal is provided by use of a glass frit.

8. An apparatus as in claim 6 wherein said lower vacuum member is coupled to said lower surface of said refrigerator device by use of a glass frit.

9. An apparatus as in claim 5 wherein said optically transparent means is secured such that energy from said scene of interest may be collected and measured by said detector assembly.

10. An apparatus as in claim 5 wherein said optically transparent means is hermetically sealed to said side wall by use of glass frit.

11. An apparatus as in claim 10 wherein said optically transparent means is coupled to said refrigerator means by use of solder.

12. An apparatus as in claim 10 wherein said optically transparent means is coupled to said refrigerator means by use of welding.

13. An apparatus as in claim 1 wherein said optically transparent means is a spectral filter.

14. An apparatus as in claim 1 wherein said optically transparent means is a lens.

15. An apparatus as in claim 1 wherein said refrigerator means operates on the principle of the Joule-Thomson effect.

* * * * *

UNITED STATES PATENT AND TRADEMARK OFFICE
CERTIFICATE OF CORRECTION

PATENT NO. : 4,766,316

DATED : August 23, 1988

INVENTOR(S) : David L. Jungkman

It is certified that error appears in the above-identified patent and that said Letters Patent is hereby corrected as shown below:

```
Column 5, line 27, after "desired" please change "wave and"
        to--waveband--.
```

Signed and Sealed this

Tenth Day of January, 1989

Attest:

DONALD J. QUIGG

Attesting Officer

Commissioner of Patents and Trademarks